United States Patent [19]

Logothetis

[11] Patent Number: 5,867,072
[45] Date of Patent: Feb. 2, 1999

[54] BIPHASE MODULATOR WITH BALUN DESIGN

[75] Inventor: James J. Logothetis, East Stroudsburg, Pa.

[73] Assignee: Merrimac Industries, Inc., West Caldwell, N.J.

[21] Appl. No.: 14,539

[22] Filed: Jan. 28, 1998

Related U.S. Application Data

[60] Provisional application No. 60/054,152 Jul. 29, 1997.

[51] Int. Cl.$^6$ .................................................. H04L 27/20
[52] U.S. Cl. ........................... 332/103; 332/105; 333/26; 375/282; 455/327
[58] Field of Search .................................... 332/103, 105; 375/279, 282, 308; 455/327; 333/26

[56] References Cited

U.S. PATENT DOCUMENTS

| 4,430,758 | 2/1984 | Snyder | 333/26 |
| 5,081,432 | 1/1992 | Devlin et al. | 332/103 |
| 5,428,840 | 6/1995 | Sadhir | 333/26 |

OTHER PUBLICATIONS

Nathan Marchand, "Transmission–Line Conversion," *Electronics*, Dec. 1944, pp. 142–145, vol. 17, No. 12, Penton Publishing Inc., San Jose, CA.

George Oltman, "The Compensated Balun," *IEEE Transactions on Microwave Theory and Techniques*, Mar. 1966, pp. 112–119, vol. MTT–14, No. 3, Institute of Electrical & Electronics Engineers, Inc., Piscataway, NJ.

Ben R. Hallford, "A Designer's Guide to Planar Mixer Baluns," *Microwaves*, Dec. 1979, pp. 52–53, 56–57, Penton Publishing, Inc., Hasbrook Heights, NJ.

Chen Y. Ho, "New Analysis Technique Builds Better Baluns," *Microwave & RF*, Aug. 1985, pp. 99–102, Penton Publishing, Inc.—Pub., Cleveland, OH.

Rick Sturdivant, "Balun Designs for Wireless, . . . Mixers, Amplifiers and Antennas," *Applied Microwave Magazine*, Summer, 1993, pp. 34–44, Noble Publishing Corp., Tucker, GA.

Steve Maas, "The Diode–Ring Mixer," *RF Design Magazine*, Nov. 1993, pp. 54–62, Arbus Business, Englewood, CO.

O. Palamutcuoglu, I. Kurhan, "Broadband Microwave Mixer Mounted on Suspended Line Baluns," *1994 IEEE*, Jun. 1994, pp. 500–503, 0–7803–1772–6/94, IEEE, Piscataway, NJ.

Ichihiko Toyoda, Makoto Hirano, Tsuneo Tokumitsu, "Three–Dimensional MMIC and Its Application: An Ultra–Wideband Miniature Balun," *IEICE Trans. Electron.*, Aug. 1995, pp. 919–924, vol. E78–C, No. 8, Institute of Electronics, Information and Communications Engineers, Tokyo, Japan.

Hwann–Kaeo Chiou, Chi–Yang Chang, Hao–Hsiung Lin, "Balun Designfor Unipolar Broad Band Double Balanced Mixer," *Electronics Letters*, Nov. 23, 1995, pp. 2113–2114, vol. 31 No. 24, IEEE Operations Center, Piscataway, NJ.

B.P. Kumar, G.R. Branner, G. Razmafrouz, "An Improved Planar Balun Design for Wireless Microwave and RF Applications," *1997 IEEE*, Apr. 1997, pp. 257–260, 0–7803–3636–4/97, IEEE, Piscataway, NJ.

*Primary Examiner*—Siegfried H. Grimm
*Attorney, Agent, or Firm*—Chadbourne & Parke LLP

[57] ABSTRACT

A double-balanced microwave biphase modulator circuit is provided with a first balun for transforming the unbalanced RF Input impedance to a balanced diode impedance and providing direct current ground return paths, and a second balun for transforming the balanced diode impedance to the unbalanced RF Output impedance and providing access for data input. The first balun consists of a transmission line attached from a coupled pair of transmission lines to ground. The second balun consists of three pairs of coupled transmission lines, in which the first two pairs of transmission lines are attached to a diode ring, to a data input filter, to a circuit ground, and to the third pair of transmission lines.

12 Claims, 4 Drawing Sheets

OTHER PUBLICATIONS

T. Gokdemir, S.B. Economides, A. Khalid, A.A. Rezazadeh, I.D. Robertson, "Design and Performance of GaAs MMIC CPW Baluns Using Overlaid and Spiral Couplers," *1997 IEEE MTT–S Digest,* Jun. 1997, pp. 401–404, 0–7803–3814–6/97, IEEE, Piscataway, NJ.

R.H. Jansen, J. Jotzo, M. Engels, "Improved Compaction of Multilayer MMIC/MCM Baluns Using Lumped Element Compensation," *1997 IEEE MTT–S Digest,* pp. 277–280, 0–7803–3814–6/97, IEEE, Piscataway, NJ.

M.N. Tutt, H.Q. Tserng, A. Ketterson, "A Low Loss, 5.5 Ghz—20 Ghz Monolithic Balun," *1997 IEEE MTT–S Digest,* Jun. 1997, pp. 933–936, IEEE, Piscataway, NJ.

Bert C. Henderson, "Mixers: Part 2 Theory and Technology," *RF Microwave Designer's Handbook,* 1998, pp. 476–483, Watkins–Johnson Company, New York.

BIPHASE MODULATOR WITH BALUN DESIGN

Applicant hereby claims the benefit of the earlier filing date of Provisional Patent Application No. 60/054,152 entitled "Biphase Modulator With Balun Design", filed Jul. 29, 1997, pursuant to 35 U.S.C. § 119(e).

FIELD OF THE INVENTION

This invention relates to biphase modulators, such as a double-balanced microwave mixer, with a balun design. More particularly, this invention discloses a new balun design, in which a broadside coupled, suspended substrate transmission line has a short-circuited, high impedance transmission line that is short-circuited to ground and attached to the unbalanced end of a coupled-line balun.

BACKGROUND OF THE INVENTION

Over the decades, wireless communication systems have become more and more technologically advanced, with performance increasing in terms of smaller size, operation at higher frequencies and the accompanying increase in bandwidth, lower power consumption for a given power output, and robustness, among other factors. The trend toward better communication systems puts ever-greater demands on the manufacturers of these systems.

Today, the demands of satellite, military, and other cutting-edge digital communication systems are being met with microwave technology.

Many of these systems use digital phase modulation, such as biphase modulation, to encode data onto the carrier wave. This requires modulators at the transmission end and demodulators (mixers) at the receiving end of a communication signal. In many microwave communication applications, a double-balanced microwave mixer is utilized as a biphase modulator. Examples of microwave mixers that are built for this purpose are disclosed in Maas, S., *Microwave Mixers*, 2nd Edition, Artech House, 1993.

It is preferable for biphase modulators, such as those operating at X-band or K-band frequencies, to have minimal phase and amplitude imbalance in order to eliminate errors in data transmission. There is also a need to isolate balanced and unbalanced circuitry while conveying signal information between them. Typical double-balanced microwave mixers and biphase modulators are composed of rings of Schottky diodes and baluns. The baluns are transmission line structures that transform an unbalanced system impedance to or from a balanced diode impedance, thereby isolating balanced and unbalanced circuitry while allowing signal information to travel between them. Typical balun designs used with biphase modulators are disclosed in Sturdivant, R., *Balun Designs for Wireless, . . . Mixers, Amplifiers, Antennas*, Applied Microwave, summer 1993.

The structure of a balun typically used for this application is a broadside coupled, suspended transmission line with a short-circuited quarter-wave, high impedance transmission line that is attached to the balanced end of the coupled line. Alternatively, two short-circuited lines, or shunt inductors, may be used at the balanced end of the balun as a shorting transformer. In either case, a short-circuited line provides a direct current return for the diode currents, but has the detrimental effect of decreasing the effective bandwidth of the balun if the length of the line is not carefully chosen and precisely manufactured, and also degrades the phase and amplitude balances of the modulator.

An effective biphase modulator has several attributes. It is important that the two binary states of the modulator are balanced. Ideally the amplitudes of the two states are equal to each other, and the phase difference is exactly 180 degrees. However, the precise balance of the amplitude and phase between the two binary states is limited by any asymmetry of the balun structure. The balance is also limited by stray reactances introduced by the ring of Schottky diodes.

In space or satellite applications, circuitry employing biphase modulators are often subjected to tremendous stress, such as the severe vibrations and mechanical shock experienced during a launch. A syntactic foam powder is often utilized to fill the cavity around the circuitry to prevent damage to the circuit components. It is apparent to those skilled in the art that the placement of foam around the circuitry exacerbates the effects of an asymmetric balun by introducing a material with a higher dielectric constant and loss tangent than air. The permittivity of the foam significantly increases the insertion loss of the modulator, and causes the phase and amplitude imbalance created by the asymmetric balun to become substantially worse.

SUMMARY OF THE INVENTION

The present invention relates to an improvement over the classic balun structure typically utilized in the biphase modulator of a microwave circuit. The balun structure being disclosed provides superior performance by maximizing electromagnetic symmetry in the circuit and minimizing stray reactances at the diode mixing plane.

It is apparent to those skilled in the art of microwave mixers that a digital biphase modulator may also be implemented as a demodulator. Based on the following disclosure, one could easily implement the described invention as a demodulator.

It is also apparent to those skilled in the art of microwave mixers that multiple biphase modulators may be combined to achieve higher order modulation schemes. For example, one may form modulators with multiple phase and amplitude states and the corresponding demodulation configurations using the invention described herein.

It is an object of this invention to improve the amplitude balance of the two binary states of a biphase modulator.

It is another object of this invention to improve the phase balance of the two binary states of a biphase modulator.

It is yet another object of this invention to create optimized symmetry of a biphase modulator to provide carrier suppression heretofore unknown in the art.

It is still another object of this invention to largely eliminate stray reactances from the diode mixing plane in a biphase modulator circuit, thereby reducing the detrimental effects of introducing syntactic foam in the cavities of the circuit.

It is still another object of this invention to enable bi-directional operation of the biphase modulator, allowing a microwave signal to be modulated from the modulator input to the modulator output as well as from the modulator output to the modulator input, without degradation in performance.

It is a further object of this invention to improve the manufacturability of microwave biphase modulators, by providing a balun design that is inherently more symmetric and more robust.

DETAILED DESCRIPTION OF THE INVENTION

Figure 1:
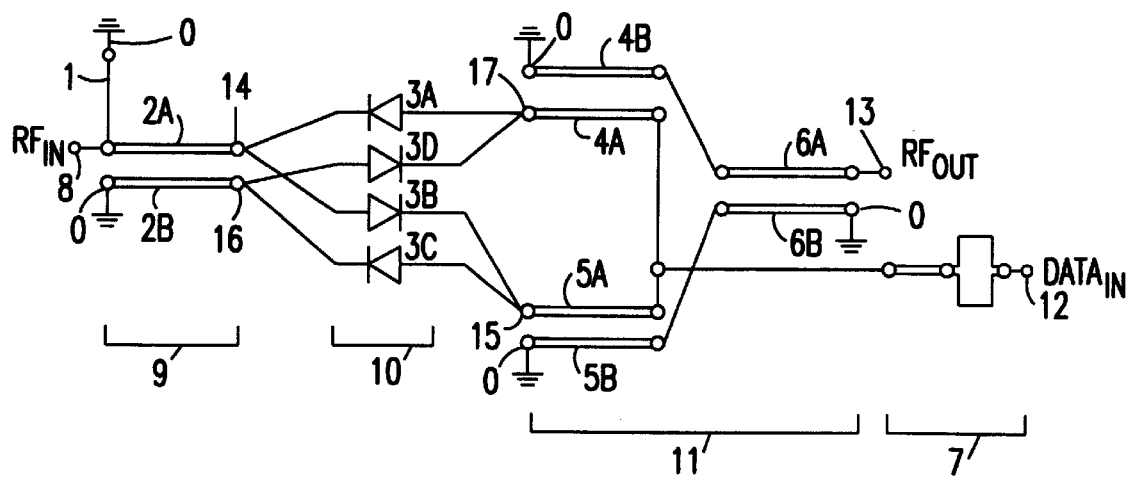
FIG. 1 is a schematic diagram of an embodiment of the microwave biphase modulator.

Referring to FIG. 1, transmission line 1 provides a direct current path to ground 0. Transmission line 2A, which is a through line, and transmission line 2B, which is a coupled line connected to ground at its unbalanced end, together with transmission line 1, form a first balun 9. Microwave signal $RF_{IN}$ is introduced at RF input port 8 at the intersection of transmission line 1 and transmission line 2A, and reaches a diode ring 10 composed of diodes 3A, 3B, 3C and 3D.

Balun 9 affects the bandwidth of operation for the circuit. Balun 9 also determines the input impedance match for the incoming microwave signal at RF input port 8, which is typically between 25 and 100 ohms, and preferably approximately 50 ohms. Balun 9 also transforms the unbalanced input impedance at RF input port 8 to the balanced diode impedance at diode ring 10. Balun 9 also splits the microwave signal 180 degrees out of phase. The underlying theory of how the properties of baluns affect impedances and signals is disclosed in Collin, R. E., *Foundations for Microwave Engineering*, McGraw Hill, 1996.

Incoming data $DATA_{IN}$ is introduced at data input port 12 and is filtered through low-pass filter 7. Low-pass filter 7 determines the bandwidth for the incoming data by limiting the frequencies that may pass through, and isolates the microwave signal from data input port 12. Coupled transmission lines 4A and 4B, coupled transmission lines 5A and 5B, and coupled transmission lines 6A and 6B form a second balun 11 with a virtual ground at the point where transmission lines 4A and 5A connect with low-pass filter 7. Balun 11 affects the bandwidth of operation for the circuit, and is ideally set to operate at the same band of operation as balun 9. Balun 11 also determines the modulator's output impedance match at RF output port 13, which is typically between 25 and 100 ohms, and preferably approximately 50 ohms. Balun 11 also transforms the balanced diode impedance of diode ring 10 to the unbalanced output impedance at $RF_{OUT}$. Balun 11 further recombines the microwave signal 180 degrees out of phase.

The microwave signal $RF_{IN}$ introduced at RF input port 8 travels down the length of transmission line 2A and transmission line 2B to connect with diode ring 10 at connections 14 and 16. Incoming data signal $DATA_{IN}$ introduced at data input port 12 commutates the microwave signal from first balun 9 to transmission lines 4A and 5A of second balun 11. The effect of the commutation is to change the insertion phase polarity of the microwave signal by 180 degrees through diode biasing as described below.

Biasing of diodes 3A, 3B, 3C, and 3D in diode ring 10 are determined by the polarity of the bipolar data signal $DATA_{IN}$ introduced at data input port 12 and the resulting polarity at connections 15 and 17. When the polarity of the data is positive, diode 3A is forward biased and diode 3B is reverse biased to ground 0 through transmission line 1. At the same time, diode 3C is forward biased and diode 3D is reverse biased through transmission line 2B. The biasing of diodes 3A, 3B, 3C and 3D due to positive polarity data has the effect of connecting transmission line 2A to transmission line 4A and connecting transmission line 2B to transmission line 5A. The microwave signal is transferred through transmission lines 6A and 6B to RF output port 13. The signal $RF_{OUT}$ at RF output port 13 is then 180 degrees out of phase with the negative polarity insertion phase.

Conversely, when the polarity of the data is negative, diode 3B is forward biased and diode 3A is reverse biased to ground 0 through transmission line 1. At the same time, diode 3D is forward biased and diode 3C is reverse biased through transmission line 2B. The biasing of diodes 3A, 3B, 3C, and 3D due to negative polarity data has the effect of connecting transmission line 2A to transmission line 5A and connecting transmission line 2B to transmission line 4A. The microwave signal is transferred through transmission lines 6A and 6B to RF output port 13. The signal $RF_{OUT}$ at RF output port 13 is then 180 degrees out of phase with the positive polarity insertion phase.

Figure 2C:
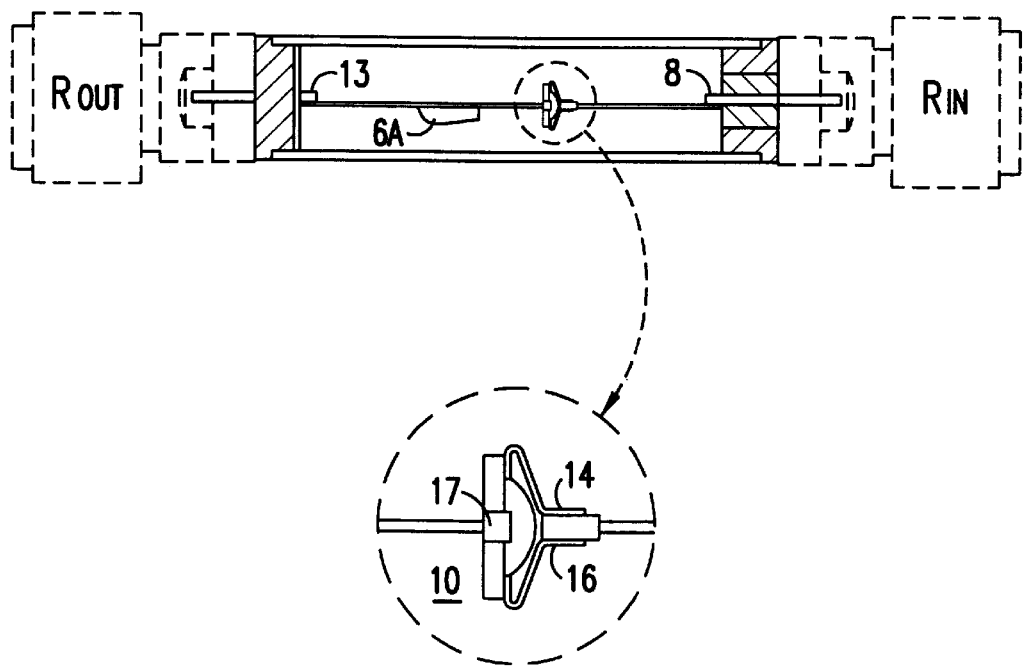
FIG. 2C is a diagram of a side cross-section of a physical assembly embodiment of the circuit in FIG. 1.
Figure 2A:
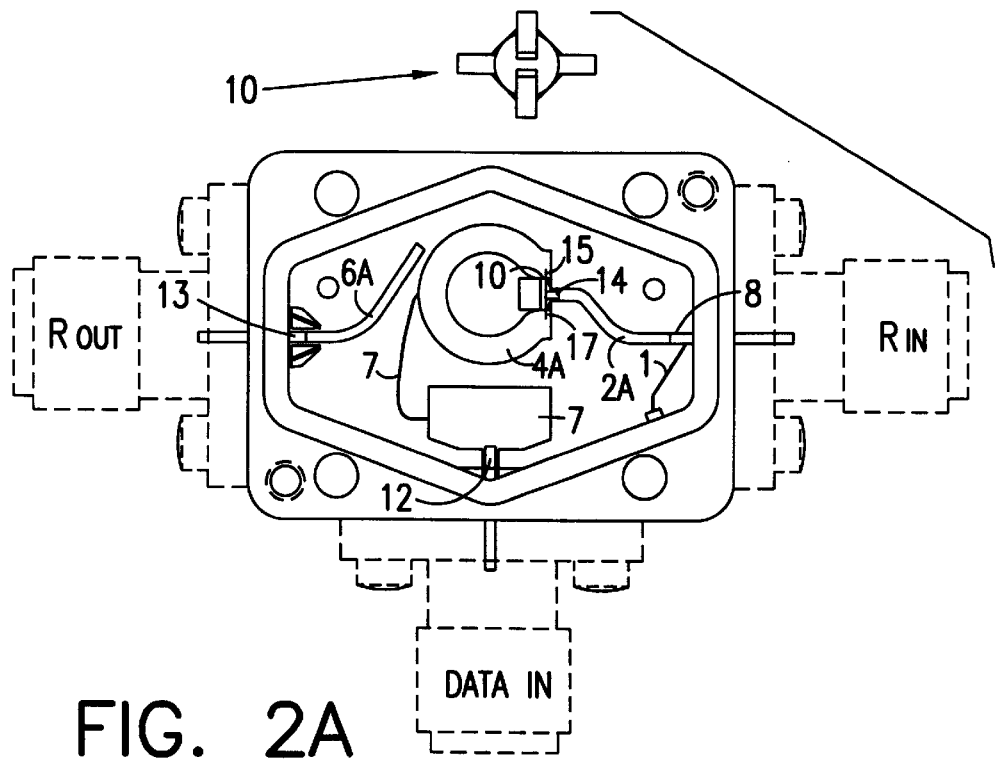
FIG. 2A is a diagram of a first upward-facing layer of a physical assembly embodiment of the circuit in FIG. 1.
Figure 2B:
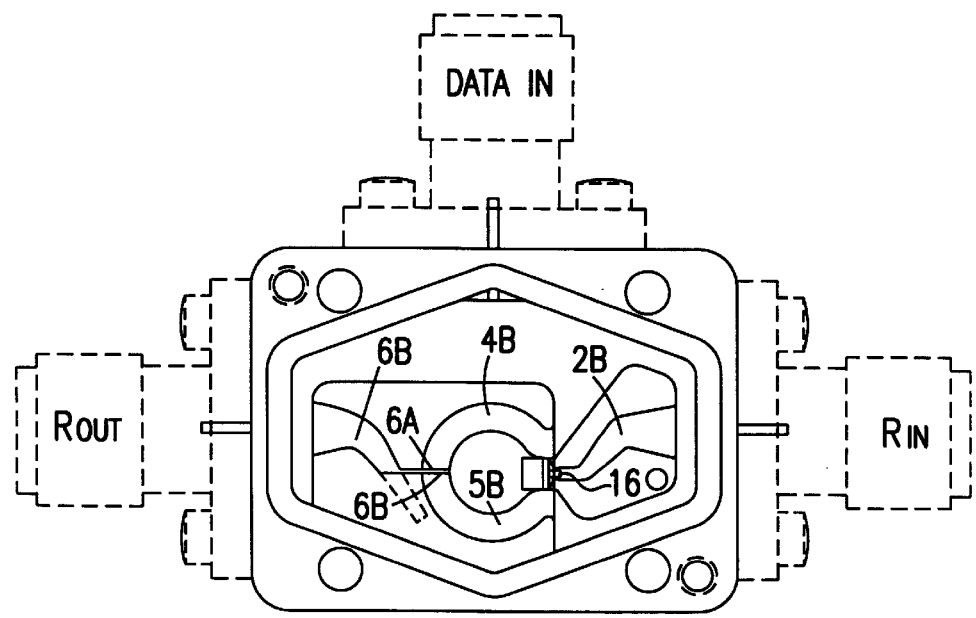
FIG. 2B is a diagram of a second downward-facing layer of a physical assembly embodiment of the circuit in FIG. 1, that is situated on top of the first upward-facing layer.

A preferred embodiment of the invention is illustrated in FIGS. 2A, and 2B, and 2C. The dimensions and other attributes of the components disclosed below are based on calculations taken from Wheeler, H., *Transmission-Line Properties of Parallel Strips Seoarated by a Dielectric Sheet*, IEEE Transactions on Microwave Theory and Techniques, March 1965, pp. 172–185. This particular embodiment may be used for carrier waves having frequencies between approximately 3 GHz and approximately 16 GHz. However, it is optimized for an 8.2 GHz carrier wave. It is apparent to those skilled in the art that one may use the calculations disclosed in the references above to effect designs that function at other frequencies.

With reference to FIGS. 2A, 2B, and 2C, the modulator is a planar microwave integrated circuit, printed on an approximately 0.005 inches thick PTFE/glass substrate clad with copper. The relative permittivity of the substrate is between 1 and 4, preferably 2.2, and the copper thickness is approximately 0.00067 inches. The coupled transmission lines are of the form described in the Wheeler reference and are calculated using the equations on page 179 of his reference. Transmission lines 2A, 2B, 6A, and 6B transition from approximately 50 ohms in microstrip to approximately 50 ohms balanced line, and are approximately a quarter wavelength long at 8.2 GHz. The width of transmission lines 2A and 6A taper linearly from approximately 0.014 inches to approximately 0.020 inches according to the formula W=0.024L+0.014. The width of transmission lines 2B and 6B taper exponentially from approximately 0.100 inches to approximately 0.020 inches according to the formula W=0.1 exp(4L(ln(0.2))). The width and length of transmission lines 4A, 4B, 5A, and 5B are approximately 0.044 inches and approximately 0.250 inches respectively. The impedance of transmission lines 4A, 4B, 5A, and 5B is typically 25 ohms to 50 ohms, preferably 35 ohms. The electrical length of transmission lines 4A, 4B, 5A, and 5B is approximately a quarter wavelength at 8.2 GHz. Transmission line 1 is approximately 0.003 inches wide by approximately 0.117 inches long. Data filter 7 is composed of a transmission line that is approximately 0.003 inches wide by approximately 0.250 inches long, and a transmission line that is approximately 0.1 inches by approximately 0.2 inches. Ring of four Schottky diodes 10 may be soldered in place as shown in FIGS. 2A and 2C. Transmission line 6A may be connected to transmission line 4B, and transmission line 6B may be connected to transmission line 5B by the bending and soldering in place as shown in FIGS. 2B and 2C. The assembly may be housed in a hermetic package (approximately 0.800 inches by 0.590 inches by 0.190 inches) and filled with syntactic foam.

Figure 3A:
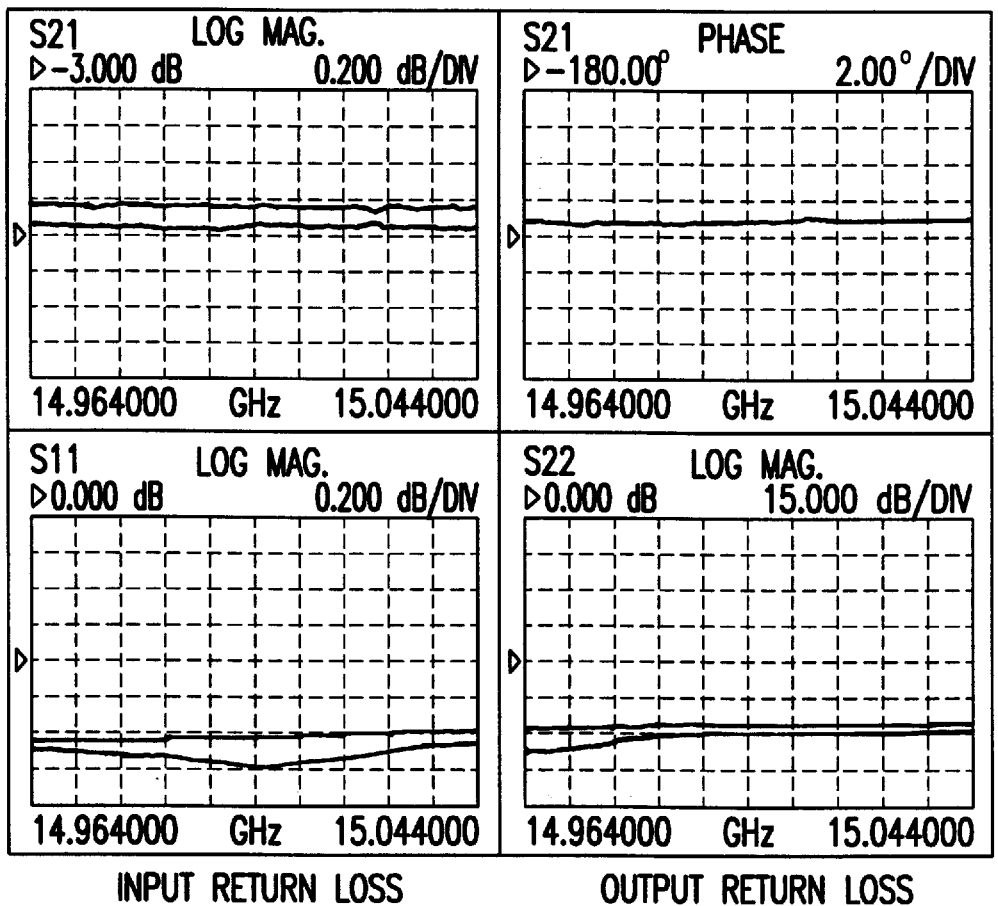
FIG. 3A is a collection of graphical plots summarizing typical test data of the circuit for transmission in the forward direction (i.e. input signal is applied at $RF_{IN}$ and output signal is at $RF_{OUT}$.

Referring to FIG. 3A, the typical electrical performance characteristics of the described circuit in the forward transmission direction (input signal is applied at $RF_{IN}$ and output signal is at $RF_{OUT}$) as measured in an experimental run is as follows: insertion loss less than 3.0 dB, amplitude balance less than 0.2 dB, phase balance less than 1.0 degree, return loss greater than 25 dB.

Figure 3B:
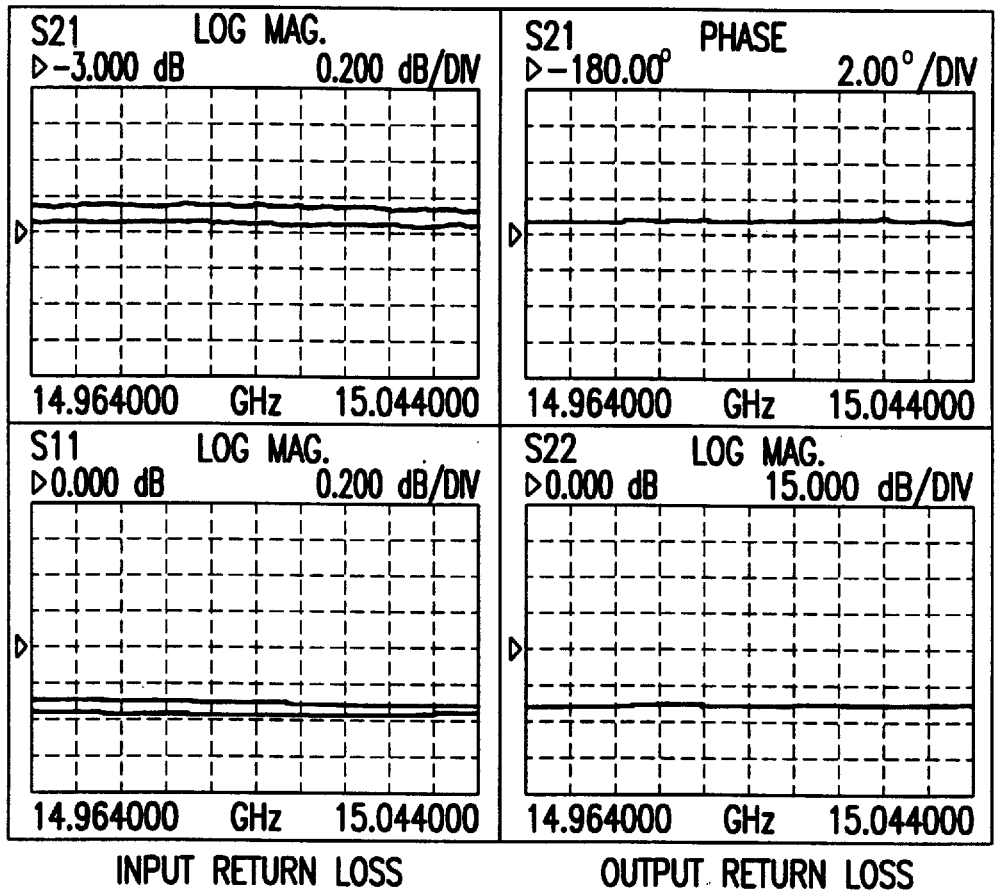
FIG. 3B is a collection of graphical plots summarizing typical test data of the circuit for transmission in the reverse direction (i.e. input signal is applied at $RF_{OUT}$ and output signal is at $RF_{IN}$.

It is apparent to those skilled in the art that certain biphase modulators are bi-directional and may be used to modulate a microwave signal applied at the output of the modulator. Referring to FIG. 3B, the typical electrical performance characteristics of the described circuit in the reverse transmission direction (input signal is applied at $RF_{OUT}$ and output signal is at $RF_{IN}$) as measured in an experimental run is as follows: insertion loss less than 3.0 dB, amplitude balance less than 0.2 dB, phase balance less than 1.0 degree, return loss greater than 20 dB.

I claim:

1. A microwave biphase modulator circuit having a first balun, a second balun, a diode ring, and a circuit ground, said first balun comprising:

a first transmission line having a first end and a second end, wherein said first end of said first transmission line is connected to said circuit ground and said second end of said first transmission line is connected to an input port;

a second transmission line having a first end and a second end, wherein said first end of said second transmission line is connected to said second end of said first transmission line and said second end of said second transmission line is connected to said diode ring;

a third transmission line electromagnetically coupled to said second transmission line and having a first end and a second end, wherein said first end of said third transmission line is connected to said circuit ground and said second end of said third transmission line is connected to said diode ring;

said second balun comprising:

a fourth transmission line having a first end and a second end, wherein said first end of said fourth transmission line receives input data and said second end of said fourth transmission line is connected to said diode ring;

a fifth transmission line electromagnetically coupled to said fourth transmission line and having a first end and a second end, wherein said second end of said fifth transmission line is connected to said circuit ground;

a sixth transmission line having a first end and a second end, wherein said first end of said sixth transmission line receives said input data and said second end of said sixth transmission line is connected to said diode ring;

a seventh transmission line electromagnetically coupled to said sixth transmission line and having a first end and a second end, wherein said second end of said seventh transmission line is connected to said circuit ground;

an eighth transmission line having a first end and a second end, wherein said first end of said eighth transmission line is connected to said first end of said fifth transmission line and said second end of said eighth transmission line is connected to an output port; and a ninth transmission line electromagnetically coupled to said eighth transmission line and having a first end and a second end, wherein said first end of said ninth transmission line is connected to said first end of said seventh transmission line and said second end of said ninth transmission line is connected to said circuit ground.

2. The microwave biphase modulator circuit of claim 1, wherein said microwave biphase modulator circuit operates at a frequency between approximately 3 GHz and approximately 16 GHz.

3. The microwave biphase modulator circuit of claim 1, wherein said microwave biphase modulator circuit contains a substrate having a relative permittivity between approximately 1 and approximately 4.

4. The microwave biphase modulator circuit of claim 1, wherein said second transmission line, said third transmission line, said fourth transmission line, said fifth transmission line, said sixth transmission line, said seventh transmission line, said eighth transmission line and said ninth transmission line have a center frequency of operation and have a length of approximately one quarter wavelength of an input signal having a frequency equal to said center frequency of operation.

5. A microwave biphase modulator circuit having a circuit ground and a balun, said balun comprising:

a first transmission line having a first end connected to said circuit ground and having a second end connected to an input port; and a pair of transmission lines having a first end connected to said circuit ground and to said second end of said first transmission line and having a second end connected to a circuit ground and to a diode ring.

6. The microwave biphase modulator circuit of claim 5, wherein said balun operates at a frequency between approximately 3 GHz and approximately 16 GHz.

7. The microwave biphase modulator circuit of claim 5, wherein said microwave biphase modulator circuit contains a substrate having a relative permittivity between approximately 1 and approximately 4.

8. The microwave biphase modulator circuit of claim 5, wherein said microwave biphase modulator circuit has a center frequency of operation and wherein said pair of transmission lines has a length of approximately one quarter wavelength of an input signal having a frequency equal to said center frequency of operation.

9. A method of balancing a microwave biphase modulator circuit having a diode ring, an input port, an output port and a data input port, comprising the steps of:

providing a first balun to balance said microwave biphase modulator circuit at said input port, said first balun consisting of a first transmission line having a first end and a second end, wherein said first end of said first transmission line is connected to a circuit ground and said second end of said first transmission line is connected to said input port;

a second transmission line having a first end and a second end, wherein said first end of said second transmission line is connected to said second end of said first transmission line and said second end of said second transmission line is connected to said diode ring;

a third transmission line coupled to said second transmission line and having a first end and a second end, wherein said first end of said third transmission line is connected to said circuit ground and said second end of said third transmission line is connected to said diode ring; and providing a second balun to balance said microwave biphase modulator circuit at said output port.

10. The method of balancing a microwave biphase modulator circuit of claim 9, wherein said microwave biphase modulator circuit operates at a frequency between approximately 3 GHz and approximately 16 GHz.

11. The method of balancing a microwave biphase modulator circuit of claim 9, wherein said microwave biphase modulator circuit contains a substrate having a relative permittivity between approximately 1 and approximately 4.

12. The method of balancing a microwave biphase modulator circuit of claim 9, wherein said microwave biphase modulator circuit has a center frequency of operation and wherein said second transmission line and said third transmission line have a length of approximately one quarter wavelength of an input signal having a frequency equal to said center frequency of operation.

* * * * *